US008663906B2

(12) United States Patent
Dammel et al.

(10) Patent No.: US 8,663,906 B2
(45) Date of Patent: *Mar. 4, 2014

(54) SILICON-CONTAINING COMPOSITION FOR FINE PATTERN FORMATION AND METHOD FOR FINE PATTERN FORMATION USING THE SAME

(75) Inventors: Ralph R Dammel, Somerville, NJ (US); Wen-Bing Kang, Kakegawa (JP); Yasuo Shimizu, Kokubunji (JP); Tomonori Ishikawa, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 591 days.

This patent is subject to a terminal disclaimer.

(21) Appl. No.: 12/733,451

(22) PCT Filed: Sep. 12, 2008

(86) PCT No.: PCT/JP2008/066556
§ 371 (c)(1),
(2), (4) Date: Mar. 2, 2010

(87) PCT Pub. No.: WO2009/035087
PCT Pub. Date: Mar. 19, 2009

(65) Prior Publication Data
US 2010/0255430 A1    Oct. 7, 2010

(30) Foreign Application Priority Data
Sep. 12, 2007   (JP) ................................ 2007-236974

(51) Int. Cl.
G03F 7/20       (2006.01)
G03F 7/30       (2006.01)
G03F 7/40       (2006.01)

(52) U.S. Cl.
USPC ........ 430/311; 430/270.1; 430/325; 430/326; 430/330

(58) Field of Classification Search
None
See application file for complete search history.

(56) References Cited

U.S. PATENT DOCUMENTS

| 6,376,157 | B1 | 4/2002 | Tanaka et al. |
| 7,026,099 | B2 | 4/2006 | Kato et al. |
| 8,084,186 | B2 * | 12/2011 | Abdallah et al. ............ 430/270.1 |
| 2003/0215749 | A1 * | 11/2003 | Kato et al. .................... 430/296 |
| 2004/0028828 | A1 * | 2/2004 | Aoki et al. .................... 427/387 |
| 2004/0081912 | A1 * | 4/2004 | Nagahara et al. .......... 430/270.1 |
| 2004/0110099 | A1 | 6/2004 | Kozawa et al. |
| 2004/0161944 | A1 * | 8/2004 | Hong et al. ................... 438/758 |
| 2007/0259287 | A1 | 11/2007 | Sakakibara et al. |

FOREIGN PATENT DOCUMENTS

| JP | 5-166717 A | 7/1993 |
| JP | 7-191214 A | 7/1995 |
| JP | 10-73927 A | 3/1998 |
| JP | 2000-267268 A | 9/2000 |
| JP | 2001-100428 A | 4/2001 |

(Continued)

Primary Examiner — Sin Lee
(74) Attorney, Agent, or Firm — Sangya Jain

(57) ABSTRACT

The present invention provides a composition for forming a fine pattern with high dry etching resistance and a method for forming the fine pattern. The composition for fine pattern formation containing: a resin containing a repeating unit having a silazane bond; and a solvent as well as a method for fine pattern formation using the same.

6 Claims, 1 Drawing Sheet

(56) References Cited

FOREIGN PATENT DOCUMENTS

| | | |
|---|---|---|
| JP | 2002-6512 A | 1/2002 |
| JP | 2003-84459 A | 3/2003 |
| JP | 2003-316019 A | 11/2003 |
| JP | 2004-191465 A | 7/2004 |
| JP | 2006-60006 A | 3/2006 |
| WO | WO 2005/116776 A1 | 12/2005 |

* cited by examiner

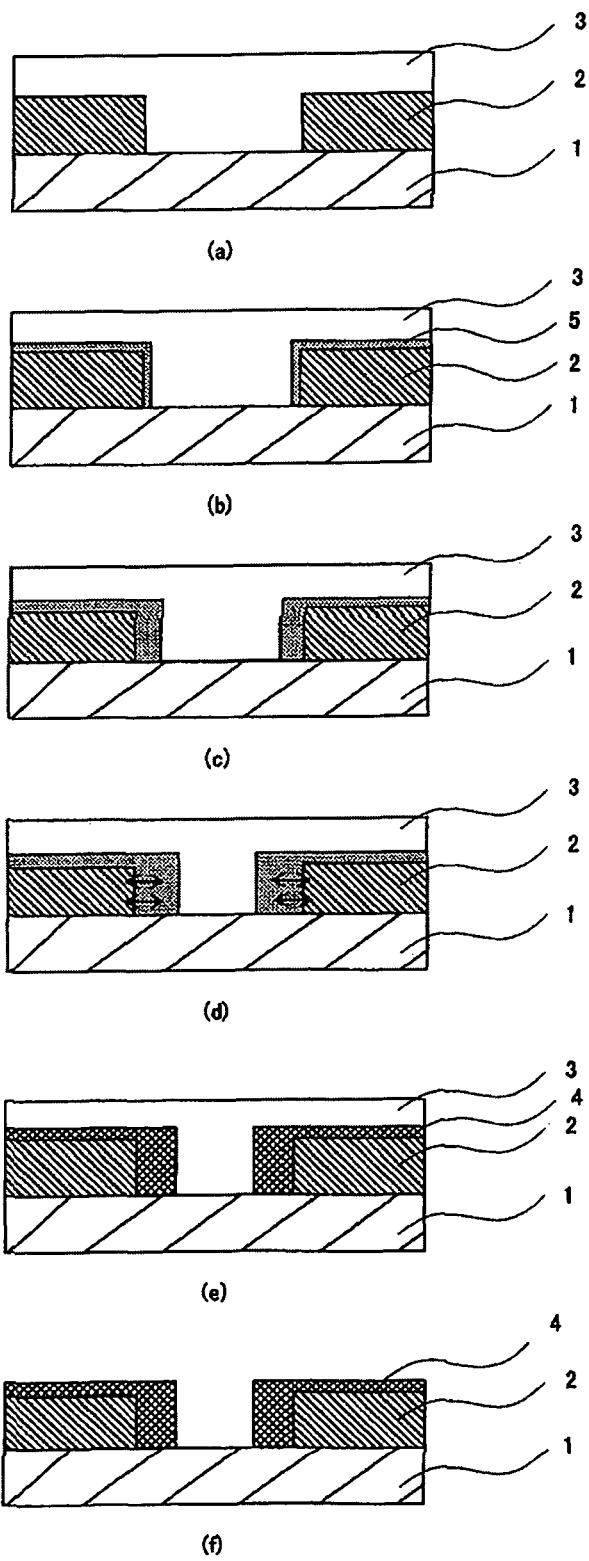

SILICON-CONTAINING COMPOSITION FOR FINE PATTERN FORMATION AND METHOD FOR FINE PATTERN FORMATION USING THE SAME

This application is a United States National Stage Patent Application under 35 U.S.C. §371 of International Patent Application No. PCT/JP2008/066556,filed Sep. 12, 2008, which claims priority to Japanese Patent Application No. 2007-236974, filed Sep. 12, 2007, the contents of both documents being hereby incorporated herein by reference.

TECHNICAL FIELD

The present invention relates to a silicon-containing composition for fine pattern formation and a method for pattern formation using this composition for fine pattern formation, by which a finer pattern can be formed in the production process of a semiconductor or the like by reducing the pitch size (between traces) or pattern aperture size of an already formed resist pattern in resist pattern formation.

BACKGROUND ART

Finer pattern formation using general photolithography techniques involves modifying exposure apparatuses. Particularly, the formation of a pattern with a pitch size of 60 nm or smaller by photolithography techniques requires special apparatuses, such as immersion photolithography developed in recent years, and requires enormous investments.

Therefore, various techniques have been studied for obtaining a fine pattern without using such expensive apparatuses. Among them, the most practical method includes forming a coating layer on an already formed resist pattern using a composition containing a water-soluble resin and, optionally, an additive, and thereby making the resist pattern finer. This technique allows, irrespective of exposure wavelengths, the formation of a fine pattern that exceeds the limits of photolithography. Such a technique has a short history and has merely been practiced for approximately 10 years. For example, the following methods have been proposed:

(1) a method including: forming a resist pattern; then applying thereonto a resist for forming mixing; forming a mixing layer by baking; and forming a pattern with a fine pattern size by developing (Japanese Patent Laid-Open No. 5-166717);

(2) a method for forming a fine pattern of an aqueous coat, including: forming a positive photoresist pattern on a substrate; subsequently uniformly exposing the pattern to electromagnetic radiation; then evenly applying thereonto an aqueous coat, and including: dissolving and removing (lifting off) the positive photoresist with an alkaline aqueous solution (Japanese Patent Laid-Open No. 7-191214);

(3) a method for achieving reduction in hole diameter or pitch width of a resist pattern, including: covering a resist pattern containing a material that generates an acid through exposure, with a resist containing a material that crosslinks in the presence of an acid; generating an acid in the resist pattern by heating or exposure; forming, as a coating layer of the resist pattern, a crosslinked layer in the interface to thicken the resist pattern (Japanese Patent Laid-Open No. 10-73927);

(4) a method for forming a fine pattern, including: preparing a fine pattern forming material by dissolving a completely water-soluble crosslinking agent and a water-soluble resin in an aqueous medium, the completely water-soluble crosslinking agent being selected from glycol lauryl having at least one imino group with a hydroxyalkyl group substituted for a hydrogen atom; and forming a resist pattern on a substrate using a chemically amplified resist containing an acid-producing agent; then providing thereon a coating film of the fine pattern forming material; forming a water-insoluble reaction layer in the interface between the resist pattern and the coating film by heat treatment; and subsequently removing an unreacted portion of the coating film with an aqueous solvent (Japanese Patent Laid-Open No. 10-73927);

(5) a method including: swelling a surface layer of a resist pattern by permeating thereinto a chemical solution containing a crosslinking agent and a swelling promoter, the crosslinking agent bringing about crosslinking in the presence of an acid; and forming a crosslinked film in the swollen surface layer of the resist pattern to form a second resist pattern (Japanese Patent Laid-Open No. 2001-100428);

(6) a method including: covering a resist pattern with a first upper layer containing an acid component; further forming thereonto a second upper layer containing a basic component; then diffusing the acid component and the basic component into the first resist pattern and into the first upper layer, respectively, by heat treatment to form a solubilized layer in the resist pattern, while neutralizing the acid component with the basic component in proximity to the interface between the first and second upper layers; and removing the solubilized layer to reduce the width of the trace (Japanese Patent Laid-Open No. 2001-100428);

(7) a method for forming a finer resist pattern, including: applying a coat forming agent for a forming finer resist pattern onto a whole or partial surface of a resist pattern formed on a substrate, the coat forming agent containing a copolymer of a (meth)acrylic acid monomer and a water-soluble vinyl monomer; and heat-shrinking the resist pattern by additional heating (Japanese Patent Laid-Open No. 2003-84459); and (8) a method for forming a resist pattern, including: applying a surfactant-containing solution onto a resist pattern; and then applying thereonto a resist pattern-thickening material containing a resin and a surfactant (Japanese Patent Laid-Open No. 2004-191465).

Furthermore, a finer resist pattern forming composition named AZ RELACS (registered trademark) is sold by AZ Electronic Materials.

These methods, in general, can easily form a fine pattern that exceeds the limits of photolithographic resolution. However, ultrafine pattern formation with a pattern size of 50 nm or smaller tends to cause defects and the like. Therefore, these methods still had room for improvement. Particularly, as a current trend, a film thickness is reduced for enhancing resist sensitivity. However, in this case, the minimum film thickness of a base substrate was sometimes insufficient for etching.

[Patent Literature 1] Japanese Patent Laid-Open Publication No. 166717/1993

[Patent Literature 2] Japanese Patent Laid-Open Publication No. 191214/1995

[Patent Literature 3] Japanese Patent Laid-Open Publication No. 73927/1998

[Patent Literature 4] Japanese Patent Laid-Open Publication No. 2000-267268

[Patent Literature 5] Japanese Patent Laid-Open Publication No. 2001-100428

[Patent Literature 6] Japanese Patent Laid-Open Publication No. 2002-6512

[Patent Literature 7] Japanese Patent Laid-Open Publication No. 2003-84459

[Patent Literature 8] Japanese Patent Laid-Open Publication No. 2004-191465

DISCLOSURE OF INVENTION

Problem to be Solved by the Invention

In light of the problems described above, an object of the present invention is to improve the dry etching resistance of a finally obtained pattern in very fine pattern formation.

Solution of Problem

A composition for fine pattern formation according to the present invention contains: a resin containing a repeating unit having a silazane bond; and a solvent that dissolves the resin and does not dissolve a resist pattern.

A method for fine pattern formation according to the present invention includes:
forming a resist pattern on a substrate by a photolithography method;
applying said composition for fine pattern formation onto the pattern;
heating the resist pattern to harden the composition for fine pattern formation present in an adjacent area of the resist pattern; and
subjecting the resist pattern to a rinsing treatment to remove the unhardened composition for fine pattern formation.

Effect of the Invention

The present invention provides a composition for forming a fine pattern with high dry etching resistance and a method for pattern formation using the same.

For the composition for fine pattern formation according to the present invention, an arbitrary material for forming a finer resist pattern can be selected. Thus, a finer pattern with high dry etching resistance can be obtained for diverse resist patterns.

BRIEF DESCRIPTION OF DRAWINGS

FIG. 1 is a diagram schematically showing a method for fine pattern formation according to the present invention.

EXPLANATION OF REFERENCE 1 substrate
2 resist film
3 layer of composition for fine pattern formation
4 insolubilized layer
5 adsorbed resin

BEST MODE FOR CARRYING OUT THE INVENTION

Composition for Fine Pattern Formation

A composition for fine pattern formation according to the present invention contains a resin containing a repeating unit having a silazane bond. In this context, the silazane bond means an Si—N bond, which has arms for binding with other units and the remaining arms substituted by an arbitrary substituent. In general, the substituent is hydrogen or a hydrocarbon group. However, the remaining arms may be substituted by a silicon-containing group or a functional group such as a hydroxyl, a carboxyl, or an amino group. Moreover, the repeating unit has two or more arms. When the repeating unit has three or more arms, the resin can assume a two-dimensional or three-dimensional structure.

Preferable examples of such a repeating unit can include those represented by the following formula (I):

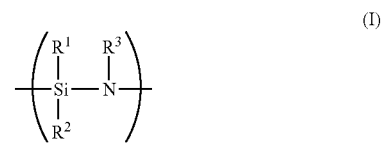

In the formula, $R^1$ to $R^3$ are each independently a group selected from the group consisting of hydrogen, a saturated hydrocarbon group having 1 to 6 carbon atoms, and a silazane group having a saturated hydrocarbon group having 1 to 6 carbon atoms. The saturated hydrocarbon group may be any of linear, branched, and cyclic hydrocarbon groups.

The resin represented by the formula (I) is generally called polysilazane. This polysilazane can assume a two-dimensional or three-dimensional structure when any of $R^1$ to $R^3$ is a silazane group represented by the formula (I). Moreover, two or more kinds of repeating units represented by the formula (I) can also be combined.

Of such resins, perhydropolysilazane consisting of only silicon, nitrogen, and hydrogen is one of preferable resins. One of the perhydropolysilazane resins is represented by the formula (I), wherein all of $R^1$ to $R^3$ are hydrogen. Moreover, another perhydropolysilazane has —(SiH$_2$NH)— and —(SiH$_2$N)< as repeating units and has hydrogen or —SiH$_3$ at the end. This perhydropolysilazane may assume various structures depending on the ratio of the repeating units contained. For example, the following structure can be exemplified:

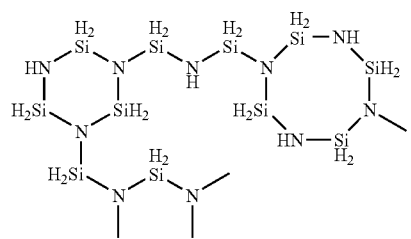

The molecular weight of such a resin is arbitrarily selected according to the type of a resist used, the type of a pattern of interest, and so on, and is preferably 500 to 100,000, more preferably 600 to 10,000, in terms of a weight-average molecular weight.

The composition for fine pattern formation according to the present invention contains a solvent. This solvent must be capable of dissolving the resin. Specifically, it is preferred that the composition should be made uniform when applied onto a resist pattern. Thus, the solubility of the resin in the solvent may be a level at which the solvent dissolves the resin so as to make the composition uniform. On the other hand, if the solvent, when applied onto a resist pattern, dissolves the pattern, the pattern is broken before being made finer. Therefore, it is required that the solvent should not dissolve the resist pattern. Furthermore, it is preferred that the solvent should be unreactive with the resin.

The solvent that can be used in the present invention can be selected arbitrarily as long as the solvent meets the requirements described above. Alternatively, the solvent can be selected according to the type of the resin used, the type of a resist material used, and so on. However, a solvent selected from the group consisting of ethers and saturated hydrocarbons, specifically, dibutyl ether and decalin, are extensively applicable even if the type of the resin or a resist material varies. Thus, such solvents are preferable. These solvents can also be used in combination of two or more of them, if necessary.

The composition for fine pattern formation according to the present invention contains the resin dissolved in the solvent. The concentration thereof is not particularly limited. However, the concentration can be adjusted appropriately according to applying properties onto a resist surface, the desired amount of pattern shrinkage, and so on. In general, the content of the resin is preferably 0.01 to 30%, more preferably 0.3 to 5%, with respect to the whole weight of the composition.

The composition for fine pattern formation according to the present invention may optionally contain other additives. Examples of such additives include surfactants, leveling agents, and plasticizers.

Method for Fine Pattern Formation

A conventional method known in the art is used as a method for fine pattern formation according to the present invention except that a composition for fine pattern formation used is the composition for fine pattern formation of the present invention. Thus, a photoresist used for forming a resist pattern and a resist formation method using the same may be any of conventional photoresists known in the art and convention resist formation methods known in the art. An arbitrary resist pattern generally used can be used. Moreover, any of conventional methods known in the art can be used as a method for coating a resist pattern with the composition for fine pattern formation.

The method for fine pattern formation according to the present invention will be described below with reference to drawings. In the description below, as an example, a resist pattern is formed with an ArF resist.

FIGS. 1(a) to 1(f) are respectively a schematic diagram for describing a method for making a pattern finer by using the composition for fine pattern formation of the present invention on the resist pattern surface. Each drawing shows a substrate 1, a resist pattern (or a trace) 2, a layer 3 of a composition for fine pattern formation, and an insolubilized layer 4 in a schematic sectional diagram form.

First, a resist (e.g., chemically amplified positive resist) is applied onto a substrate 1 to be processed, for example, a semiconductor substrate. The resist is exposed and developed by a usual method to form a positive resist pattern 2. In this context, the exposed area of the resist is almost removed by development. The characteristics of the inner wall portion of the area from which the resist is removed are different from those of a totally unexposed area. Specifically, compatibility with the solvent is enhanced. Subsequently, as shown in FIG. 1(a), the composition for fine pattern formation according to the present invention is applied to this resist pattern 2 so as to cover the resist pattern 2. As a result, a coating layer 3 is formed. A resin 5 in the composition is physically adsorbed onto the resist pattern by this application (FIG. 1(b)).

The resin adsorbed on the resist surface is permeated into the resist to swell the resist film (FIG. 1(c)). In this context, the permeation of the resin and the reaction between the resin and the resist are promoted by heating the resist (FIG. 1(d)). Then, the reaction between the resin and the resist hardly occurs in the unexposed area. Thus, a thin insolubilized layer is formed. On the other hand, the reaction between the resin and the resist easily occurs in the exposed area or in proximity to the exposed area (e.g., the side of the trace in FIG. 1). Thus, a thick insolubilized layer is formed. After the completion of the reaction, an insolubilized layer 4 is formed (FIG. 1(e)). This insolubilized layer is a layer in which the resin physically adsorbed on the initial resist surface is permeated not only into the resist surface but also into the internal region of the resist and then insolubilized. Accordingly, the pattern is shrunk. Finally, the unreacted composition for fine pattern formation can be removed by a rinsing treatment with a solvent to obtain a finer pattern (FIG. 1(f)).

As described above, the insolubilized layer 4 is formed mainly on the side of the trace in the surface of the resist pattern (trace) 2 to thereby lessen the width between the traces. As a result, the pitch size or hole aperture size of the resist pattern can be reduced effectively to form a resist pattern equal to or finer than a resolution limit.

A radiation-sensitive resin composition that can be used for forming the resist pattern 2 may be any of conventional radiation-sensitive resin compositions known in the art and publicly used. Examples of the radiation-sensitive resin composition can include: alkali-soluble resins such as novolac resins, hydroxystyrene resins, and acrylic resins; positive resists containing a quinone diazide compound; and a chemically amplified positive or negative resist that generates an acid through light irradiation and forms a resist pattern using the catalytic action of this generated acid. The radiation-sensitive resin composition is, preferably, the chemically amplified positive resist that generates an acid through light irradiation and forms a resist pattern using the catalytic action of this generated acid. Many resist materials have already been proposed and are also commercially available. Any of these resist materials known in the art and publicly used may be used. Moreover, any of conventionally known methods including an application method, an exposure method, a baking method, a development method, a developing agent, and a rinsing method can be used as a resist pattern formation method using the radiation-sensitive resin composition.

In the method for pattern formation according to the present invention, an appropriate method, for example, a spin-coating, spray-coating, immersion-coating, or roller-coating method, conventionally used for applying the radiation-sensitive resin composition may be used as a method for applying the composition for fine pattern formation of the present invention. The applied coating layer is prebaked, if necessary, to form the layer 3 of the composition for fine pattern formation. Heat treatment conditions for the layer of the composition for fine pattern formation involve, for example, a temperature of 60 to 150° C., preferably 80 to 100° C., and a time on the order of 10 to 300 seconds, preferably 60 to 120 seconds. It is preferred that intermixing should occur between the resist pattern and the layer of the composition for fine pattern formation at the selected temperature. The film thickness of the formed layer of the composition for fine pattern formation can be adjusted appropriately according to the temperature and time of the heat treatment, the types of the radiation-sensitive resin composition and water-soluble resin composition used, and so on. Thus, these conditions may be set depending on the extent to which a resist pattern is made finer, in other words, the extent to which a resist pattern needs to be widened. However, the thickness of the coating layer is generally set to 0.01 to 100 μm in terms of a thickness from the surface of the resist pattern.

Furthermore, a solvent capable of less dissolving the insolubilized layer and highly dissolving the composition for fine pattern formation is selected as the solvent used for the rinsing treatment by which the insolubilized layer 4 formed by heating is left intact and the unreacted layer 3 of the composition for fine pattern formation is removed. It is more preferred that the solvent used in the composition for fine pattern formation should be used in the rinsing treatment.

The present invention will be described below with reference to examples. However, the aspects of the present invention are not limited to only these examples.

REFERENCE EXAMPLE 1

Confirmation of Shrinkage of Unexposed Resist by Composition According to the Present Invention Polysilazane manufactured by AZ Electronic Materials was dissolved at a concentration of approximately 10% by weight in dibutyl ether and filtered the resultant solution through a 0.05-micron filter to prepare a composition for fine pattern formation.

On the other hand, an ArF resist (AX1120P (registered trademark); manufactured by AZ Electronic Materials) and a KrF resist (DX5250P (registered trademark); manufactured by AZ Electronic Materials) were separately applied to silicon wafers. The wafers were baked at 90° C. for 60 seconds without an exposure treatment to obtain substrates for a test. The composition for fine pattern formation was applied at a thickness of approximately 120 nm onto the obtained substrates for a test. The substrates were further baked at 50, 70, or 90° C. for 60 or 180 seconds and further subjected to a rinsing treatment with dibutyl ether. A film thickness was measured before the application of the composition for fine pattern formation and after the rinsing treatment. As a result, no change in film thickness was observed between them.

EXAMPLE 1

A KrF resist (DX5250P (registered trademark); manufactured by AZ Electronic Materials) was applied to silicon wafers and subjected to exposure and development treatments by usual approaches to prepare trench patterns with a 1:3 or 1:5 pitch. The composition for fine pattern formation prepared in Reference Example 1 was further applied onto the patterns. Then, the wafers were baked at 90° C. for 60 seconds. Subsequently, the patterns after baking were subjected to a rinsing treatment with dibutyl ether for 60 seconds and then spin-dried to obtain patterns. Trench widths of the patterns were measured before and after the treatment with the composition for fine pattern formation with a length measuring scanning microscope (critical dimension SEM S-9200, manufactured by Hitachi, Ltd.) to calculate the amounts of shrinkage. The obtained results are shown in Table 1.

TABLE 1

| Pattern type | 1:3 pitch | 1:5 pitch |
| --- | --- | --- |
| Size before treatment (nm) | 175 | 164 |
| Size after treatment (nm) | 159 | 148 |
| Amount of shrinkage (nm) | 16 | 16 |

These results demonstrated that a trench width is reduced by 16 nm by a treatment with the composition for fine pattern formation according to the present invention.

EXAMPLE 2

An ArF resist (AX1120P (registered trademark); manufactured by AZ Electronic Materials) was applied to a silicon wafer and subjected to exposure and development treatments by usual approaches to prepare a trench pattern. The composition for fine pattern formation prepared in Reference Example 1 was further applied onto the pattern. Then, the wafer was baked at 90° C. for 60 seconds. Subsequently, the pattern after baking was subjected to a rinsing treatment with dibutyl ether for 60 seconds and then spin-dried to obtain a pattern. A trench width of the pattern was measured before and after the treatment with the composition for fine pattern formation with a length measuring scanning microscope (S-9200, manufactured by Hitachi, Ltd.)) to calculate the amount of shrinkage. The trench width was changed from 142 nm to 127 nm and was confirmed to be reduced by 15 nm.

EXAMPLE 3

The pattern treated with the composition for fine pattern formation, which was obtained in Example 1, and the pattern before the treatment were evaluated for their resistance to oxygen plasma with an etcher (NE-5000, manufactured by ULVAC, Inc.). The film of the pattern treated with the composition for fine pattern formation according to the present invention remained much. Thus, the pattern treated with the composition for fine pattern formation was confirmed to be excellent in dry etching resistance.

The invention claimed is:

1. A method for fine pattern formation comprising:
    forming a resist pattern on a substrate by a photolithography method;
    applying a composition for fine pattern formation comprising: a resin comprising a repeating unit having a silazane bond; and a solvent which can dissolve the resin and cannot dissolve the resist pattern; onto the pattern;
    heating the resist pattern to form an insolubilized layer on the side of the resist pattern in proximity of the exposed areas of the resist film by reaction between the resin and the resist; and subjecting the resist pattern to a rinsing treatment with the same solvent as used to apply the resin and removing the unreacted composition, and thereby shrinking the space between the resist pattern for fine pattern formation.

2. The method for fine pattern formation according to claim 1, wherein the heating to form an insolubilized layer is performed under conditions of 60 to 150° C. for 10 to 300 seconds.

3. The method for fine pattern formation according to claim 1, wherein the rinsing treatment is performed with a solvent which can remove the unreacted composition.

4. A method for fine pattern formation comprising:
    forming a resist pattern on a substrate by a photolithography method; applying a composition for fine pattern formation onto the pattern, wherein the composition is a resin comprising a repeating unit having a silazane bond; and a solvent which can dissolve the resin and cannot dissolve the resist pattern wherein the resin comprises two or more kinds of repeating units having a silazane bond;
    heating the resist pattern to form a insolubilized layer on the side of the resist pattern in proximity of the exposed areas of the resist pattern by reaction between the resin and resist; and
    subjecting the resist pattern to a rinsing treatment with the same solvent as used to apply the resin and removing the unreacted composition, and thereby shrinking space between the resist pattern for fine pattern formation.

5. The method for fine pattern formation according to claim 4, wherein the heating to form an insolubilized layer is performed under conditions of 60 to 150° C. for 10 to 300 seconds.

6. The method for fine pattern formation according to claim 4, wherein the rinsing treatment is performed with a solvent which can remove the unreacted composition.

* * * * *